United States Patent [19]

Chadwick et al.

[11] 3,991,379
[45] Nov. 9, 1976

[54] LOGIC LEVEL DECODING CIRCUIT

[75] Inventors: Henry D. Chadwick, Reston, Va.;
Herbert L. Greenberg, Trumbull, Conn.

[73] Assignee: United Technologies Corporation, Hartford, Conn.

[22] Filed: June 3, 1975

[21] Appl. No.: 583,493

[52] U.S. Cl. ............................ 328/139; 178/69.5 R; 307/235 J; 328/117; 328/150
[51] Int. Cl.² .......................................... H03K 5/20
[58] Field of Search ................... 307/235 J, 235 N; 328/115–117, 119, 139, 162–164, 150; 325/349; 179/15 BS; 178/5.4 SY, 7.3 S, 7.5 S, 69.5 R

[56] References Cited
UNITED STATES PATENTS

| | | |
|---|---|---|
| 3,372,234 | 3/1968 | Bowsher et al. .................. 307/235 J |
| 3,502,993 | 3/1970 | Schürzinger et al. ............. 307/235 J |
| 3,530,385 | 9/1970 | Smith et al. ...................... 328/151 X |

Primary Examiner—John Zazworsky
Attorney, Agent, or Firm—Dominic J. Chiantera

[57] ABSTRACT

In a digital system wherein digital data having two operating logic voltage levels corresponding to two different logic states is transmitted from one unit and received at another separate unit, circuitry is provided for determining the mean voltage value of the received logic voltage levels and for comparing the mean voltage value to the received data to provide decoding of the correct logic state of the individual signal bits.

1 Claim, 2 Drawing Figures

LOGIC LEVEL DECODING CIRCUIT

BACKGROUND OF THE INVENTION

1. Field of Invention

This invention relates to the decoding of a received logic signal to determine the correct logic state of individual signal bits, and more particularly to the determination of the mean voltage value of the operating logic voltage levels of the digital signal for use in decoding of the individual signal bits.

2. Description of the Prior Art

In digital systems wherein digital data is transmitted between distinctly separate units, it is sometimes impossible to ensure the maintenance of desired operating logic voltage levels due to operating conditions, such as severe environmental changes, power supply fluctuations or system inaccuracies. In addition, the transmission of digital data between units separated at great distances from each other, such as a sensing unit transmitting data to a remote processor where the data transmission is performed over a single line (as opposed to a two line differential transmission mode), requires that consideration be given to the effects of data distortion. Such distortion may be in the form of: induced noise causing variations in the operating logic voltage levels resulting in the inability to detect logic state transitions; attenuation of the logic voltage levels due to extensive line losses causing loss of granularity and inability to detect the attenuated logic states; or the effects of common mode voltage differences between the grounds of the two systems which causes the received data to become biased at voltage levels different from the transmitted operating logic voltage levels, creating similar difficulty in detecting the true logic states.

The decoding of digital data is of critical importance in digital systems in which the transmitted data pulse train includes timing synchronization pulses at amplitudes different from that of the data itself, to provide time synchronization between the units. Such a use of modified amplitude synchronization pulses within the data pulse train, provides a less complex method of time synchronization than those employing binary codes.

In all such instances, accurate reproduction of the data requires knowledge of the mean logic voltage level to ensure accurate decoding of the true logic state of the individual signal bits.

SUMMARY OF THE INVENTION

An object of the present invention is to provide a simple, low cost circuit for decoding digital logic signals to determine the correct logic stage of the individual signal bits.

According to the present invention, in a system wherein digital data having two operating logic voltage levels corresponding to two different logic states is transmitted from one unit and received at a separate unit, the peak voltage amplitudes of the maximum and minimum received logic voltage levels are detected and summed in a circuit which provides the mean voltage value of the detected maximum and minimum levels which is compared with the individual signal bits to provide decoding of the correct logic state. In further accord with the present invention, the mean voltage value signal from the summing circuit is presented through an operational amplifier to the comparing means, with the amplifier configuration being adaptable to provide any suitable multiple of the mean voltage value.

The logic signal decoding circuitry of the present invention uses components readily available in the art, and permits variations in the circuit characteristics to make it adaptive to a number of different input signal conditions.

Other objects, features and advantages of the present invention will become more apparent in the light of the following detailed description of preferred embodiments thereof, as illustrated in the accompanying drawing.

DESCRIPTION OF THE PREFERRED EMBODIMENT

Figure 1:
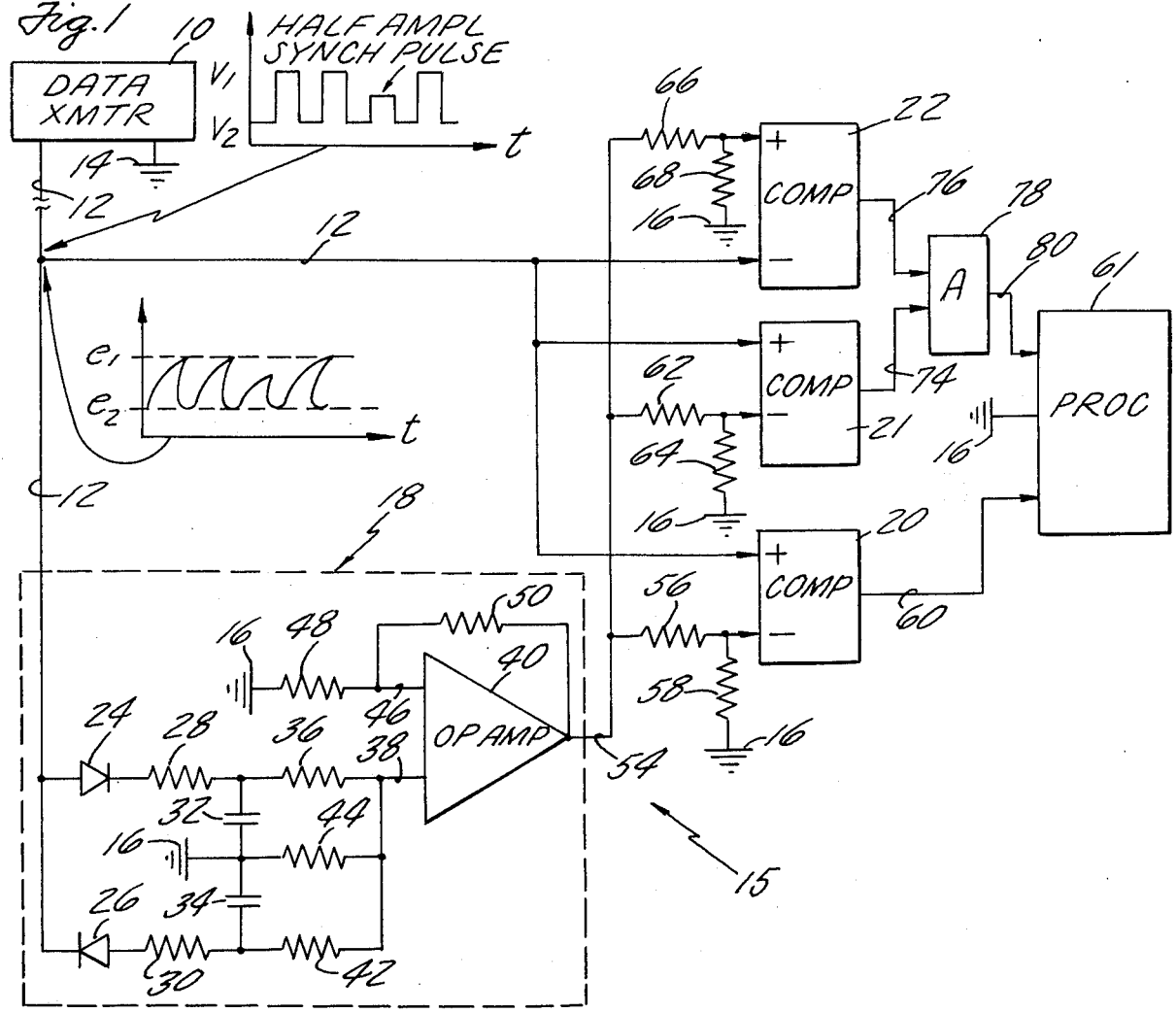
FIG. 1 is a schematic diagram of an exemplary embodiment of the invention as used in conjunction with a digital system incorporating timing synchronization pulses within the transmitted digital data pulse train.

Referring now to FIG. 1, in a preferred embodiment of the logic level decoding circuit of the present invention as utilized in a digital data system wherein the transmitted information includes timing synchronization pulses having true logic state levels equal to one-half those of the data true state logic levels, a data transmitter 10, such as a remote sensing unit, transmits a serial data pulse train on a line 12. The data pulses have a true state voltage $V_1$ and a zero state voltage $V_2$, and the sync pulses have a true state voltage amplitude equal to $\frac{1}{2}(V_1 + V_2)$. The transmitted voltage amplitudes of both data and sync pulses are measured with respect to the data transmitter ground 14. The data on the line 12 is presented to an input of a second unit, such as a receiving unit 15, which may be located at some distance from the transmitter (typical installation distances vary between 500 and 1,000 feet). At the receiver unit input, the data is measured with reference to an electrical ground 16 which is common with the data transmitter ground 14 through a common ground plane (not shown). The received data signals are attenuated and distorted due to the length and reactive impedance of the interconnecting line, and have voltage amplitudes $e_1$ and $e_2$, representing the true and zero logic levels, and a sync pulse amplitude being approximately equal to the mean value of the $e_1$, $e_2$ voltage levels. The data on the line 12 is presented to a mean value detector 18, and to comparators 20–22, of a type well known in the art such as the Fairchild $\mu$A710. The mean value detector 18 receives the data through a pair of steering diodes 24, 26 which present the positive and negative peak values respectively through input resistors 28, 30 to capacitors 32, 34 each of which is connected to ground 16. The resistor 28 and capacitor 32 are connected by a resistor 36 to the non-inverting input 38 of an operational amplifier 40 of a type well known to the art, such as the National Semiconductor LM301. The resistor 30 and capacitor 34 are similarly connected by a resistor 42 to the non-inverting input 38. A resistor 44 is also connected from the non-inverting input 38 to ground 16. The inverting node 46 of the amplifier 40 is connected to one side of a resistor 48 the other side of which is connected to ground 16. The node 46 is also connected to a feedback resistor 50, the other side of which is connected to the output of the amplifier on a line 54. The resistors 48, 50 are equal, providing a voltage gain of two volts per volt from the non-inverting node 38 to the output line 54.

In the operation of the mean value detector 18, the maximum input voltage $e_1$ is coupled through the diode 24 and resistor 28 to the capacitor 32, which charges to the peak positive value at a charging rate approximately equal to the time constant $R_{28} \times C_{32}$. Similarly, the most negative, or minimum value of input voltage $e_2$ is coupled through the diode 26 and resistor 30 to the capacitor 34, which charges to the minimum voltage value at a time constant approximately equal to $R_{30} \times C_{34}$. Typically, the time constants of both charging circuits are equal, to provide symmetrical time responses, and may be suitably varied to accommodate the frequency of the input data. Notwithstanding maximum capacitor inrush current, the resistors 28, 30 may be reduced to minimal values or even eliminated to provide faster response characteristics. The loading effect on capacitors 32, 34 due to resistors 36, 42 in series with resistor 44 to ground is insignificant since these resistors have resistive values much larger than that of the resistors 28, 30. Similarly, the diodes 24, 26 prevent the discharge of the capacitors 32, 34 back through the transmitter 10. The resistors 36, 42 are equal in value and are much less than the value of the resistor 44 ($R_{44}$ is typically 100 times greater than $R_{36}$ and $R_{42}$), so that the voltages on the capacitors 32, 34 are summed at the non-inverting input 38 of the amplifier 40 to produce the quantity $$\frac{1}{2}(e_1 + e_2) \cdot \frac{1}{ST + 1}$$

where $T \cong R_{28}.C_{32} = R_{30}.C_{34}$. The voltage gain of two volts per volt for the signal on the non-inverting input 38 provides a signal $$(e_1 + e_2) \cdot \frac{1}{ST + 1}$$

at the output of the OP AMP 40, on the line 54. The absolute value of the signal on the line 54 is representative of the sum of the maximum and minimum voltage values of the received data on line 12.

The line 54 is connected through a resistor 56 to another input of the comparator 20 and to a resistor 58, the other side of which is connected to ground 16. The values of the resistors 56, 58 are selected to provide an attenuation of one-half to the signal on the line 54 such that the signal presented to the comparator 20 is equal to the mean value of the received data maximum and minimum voltage levels, or the mean logic voltage level. The comparator 20 compares the quantity $\frac{1}{2}(e_1 + e_2)$ to the received data pulses on the line 12 to determine the relative amplitude of the individual data bits to the mean logic voltage level, thereby providing decoding of the correct logic state to produce accurate reproduction of the data on a line 60. The data on the line 60 is presented to a processor 61, where it is subsequently conditioned for the proper voltage levels required in the subsequent logic circuitry, such as $T^2L$ or CMOS logic.

To provide sensing of the half amplitude sync pulses the signal on the line 54 is presented to another input of the comparator 21 through a resistor 62, the other side of which is also connected by a resistor 64 to ground 16, and to another input of the comparator 22 through a resistor 66, the other side of which is connected to a resistor 68 to ground 16. The resistors 62, 64 provide attenuation of the signal on the line 54 to produce a bias signal $0.25 (e_1 + e_2)$ at the input of the comparator 21, while the resistors 66, 68 provide attenuation of the signal on the line 54 to produce a bias signal $0.75 (e_1 + e_2)$ at the input of the comparator 22. The output signals from the comparators 21, 22 are connected through lines 74, 76 to an AND gate 78. The comparators 21, 22 compare the data on the line 12 to the two bias signals, and in combination with the AND gate 78 function as a "window comparator" to provide the decoding of the received sync pulse. The AND gate 78 provides a discrete pulse corresponding to the synchronization signal through a line 80 to the processor 61, to provide time synchronization between the data transmitter 10 and the processor.

Figure 2:
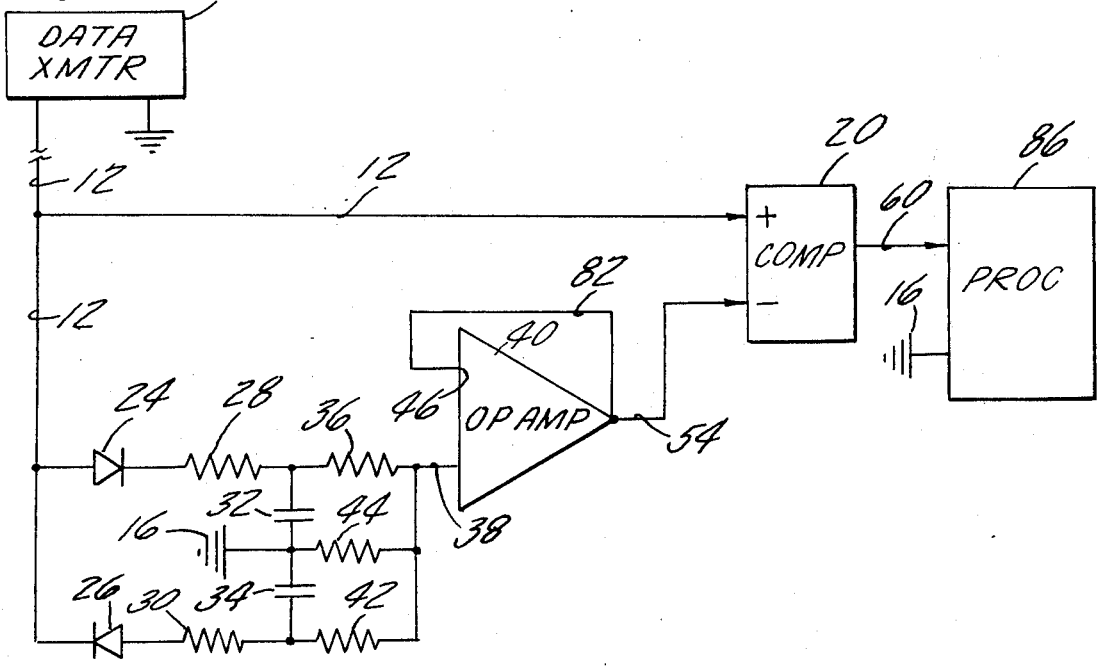
FIG. 2 is a schematic diagram of an alternative embodiment of the invention.

In a digital system having asynchronous timing between units there is no requirement for receiving amplitude modulated time synchronization pulses within the pulse data train, and the window comparator circuitry for decoding the sync pulse may be eliminated and the mean value detector 18 may be modified to directly provide the mean logic voltage level. Referring now to FIG. 2, wherein the amplifier 40 is modified to function as a voltage follower by the elimination of the resistors 48, 50 and the addition of a unity feedback path provided by a line 82 connected from the output line 54 to the inverting node 46. In this configuration the amplifier 40 provides a unity voltage gain of the signal appearing on the non-inverting node 38, such that the signal appearing on the line 54 is equal to $\frac{1}{2}(e_1 + e_2)$. The resistive attenuation network comprised of the resistors 56, 58 is eliminated and the signal on the line 54 is connected directly to the input of the comparing means 20 to provide the mean logic voltage level reference for the received data on the line 12.

In operation, a data transmitter 84 provides a serial data pulse train on a line 12, containing no time synchronization pulses. The data is received at the input of a remote unit, and as in the embodiment of FIG. 1 described hereinbefore, the maximum and minimum peak voltage values of the received logic voltage levels are detected and the mean value of these signals is provided on the non-inverting node 38 of the operational amplifier 40. The operational amplifier 40 functions as a voltage follower to provide a non-inverting, unity voltage gain such that the signal on the line 54 is representative of the mean voltage value as described hereinbefore. The mean value signal on the line 54 is presented directly to the comparing means 20 which provides decoding of the correct logic state on the line 60 as described hereinbefore with respect to FIG. 1. The data on the line 60 is presented to a processor 86, which is asynchronous with respect to the data transmitter 84.

While the embodiments of FIGS. 1 and 2 illustrate the use of the logic level decoding circuit in digital systems employing serial data transmission, decoding circuits may equally well be used in parallel data transmission systems, wherein individual decoding circuits are provided for each of the parallel data lines. The logic level decoding circuit of the present invention uses components which are readily available in the art, and permits variations in the circuit characteristics, such as frequency response and gain, to make it adaptive to a number of different input signal conditions. Similarly, although the invention has been shown and described with respect to illustrative embodiments thereof, it should be understood by those skilled in the art that the foregoing and various other changes, omissions and additions in the form and detail thereof may be made therein without departing from the spirit and the scope of the invention.

Having thus described typical embodiments of our invention, that which we claim as new and desire to secure by Letters Patent is:

1. In a system wherein digital information signals are transmitted from one unit and received at a separate unit, the digital information signals including data pulses having two operating voltage levels corresponding to a true and a zero logic state condition, and further including timing synchronization pulses having a voltage level equal to some fraction of the data pulse true logic state voltage level, circuitry for providing the correct logic state of the received data and for sensing the presence of the timing synchronization pulses, comprising:

a pair of peak detector circuits responsive to the received data pulses, one for each of the two data operating logic voltage levels, each peak detector providing an output voltage signal equal to the peak voltage value of the related logic level;

means responsive to the signals from said peak voltage detection means for providing a plurality of signals respectively representative of the mean voltage value of the peak data voltage levels, and whole and fractional multiples of said mean value;

means for comparing the received digital information signals to said mean voltage signal to provide a signal of the correct data logic state; and window comparator means for comparing the received digital information signal to said multiples signals to provide sensing of the timing synchronization pulses.

* * * * *